(12) United States Patent
Kim

(10) Patent No.: US 9,730,316 B2
(45) Date of Patent: Aug. 8, 2017

(54) MOBILE DEVICE AND MANUFACTURING METHOD THEREOF

(71) Applicant: SAMSUNG ELECTRO-MECHANICS CO., LTD., Suwon-Si, Gyeonggi-Do (KR)

(72) Inventor: Chang-Kee Kim, Suwon-Si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 206 days.

(21) Appl. No.: 14/621,061

(22) Filed: Feb. 12, 2015

(65) Prior Publication Data
US 2015/0342035 A1      Nov. 26, 2015

(30) Foreign Application Priority Data

May 22, 2014   (KR) .................. 10-2014-0061806

(51) Int. Cl.
| | |
|---|---|
| H05K 7/00 | (2006.01) |
| H05K 1/02 | (2006.01) |
| H05K 1/18 | (2006.01) |
| H05K 3/46 | (2006.01) |
| H05K 1/16 | (2006.01) |
| H01H 13/702 | (2006.01) |

(52) U.S. Cl.
CPC ......... *H05K 1/0278* (2013.01); *H01H 13/702* (2013.01); *H05K 1/16* (2013.01); *H05K 1/184* (2013.01); *H05K 3/46* (2013.01); *H05K 3/4697* (2013.01); *H01H 2205/016* (2013.01); *H01H 2225/028* (2013.01); *H05K 2201/10053* (2013.01)

(58) Field of Classification Search
USPC .......................................... 361/760, 761, 748
See application file for complete search history.

(56) References Cited

U.S. PATENT DOCUMENTS

2014/0269217 A1*   9/2014   Jenwatanavet ........ G04R 60/10
368/10

* cited by examiner

*Primary Examiner* — Andargie M Aychillhum
(74) *Attorney, Agent, or Firm* — NSIP Law

(57) ABSTRACT

A mobile device and a method of manufacturing a mobile device are disclosed. An aspect of the present invention provides a mobile device, which includes: a multi-layer circuit board including a plurality of circuit pattern layers and a plurality of dielectric layers and having a cavity formed on a lateral surface thereof toward an inside thereof; an electrode pad laminated in the cavity and configured to be electrically connected with the circuit pattern layers; and a conductive switch formed on an external peripheral portion of the cavity of the multi-layer circuit board in such a way that the conductive switch is separated from the electrode pad and is contactable with the electrode pad by an external force.

6 Claims, 3 Drawing Sheets

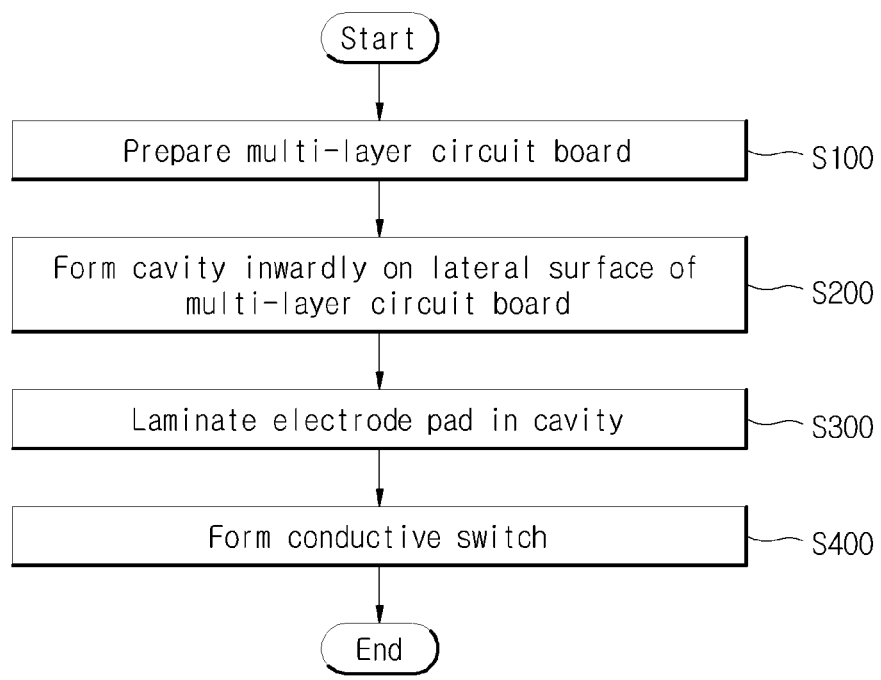

MOBILE DEVICE AND MANUFACTURING METHOD THEREOF

CROSS-REFERENCE TO RELATED APPLICATIONS

This application claims the benefit of Korean Patent Application No. 10-2014-0061806, filed with the Korean Intellectual Property Office on May 22, 2014, the disclosure of which is incorporated herein by reference in its entirety.

BACKGROUND

1. Technical Field

The present invention relates to a mobile device and a manufacturing method thereof.

2. Background Art

Various electronic devices using printed circuit boards are often configured such that switch-operated signals are inputted to the printed circuit boards. For this, additional switching tools and flexible printed circuit boards (FPCB) for connecting the switching tools to the printed circuit boards are used in addition to the printed circuit boards.

These printed circuit boards and switching tools may be used in mobile devices, such as mobile phones, more often. For example, a mobile phone can be equipped with buttons on a lateral side of a main body of the mobile phone to increase or decrease the volume, and a switching tool can be formed inside the buttons so that control signals can be generated by the switching tool when a user presses the buttons.

Then, the generated control signal can be transferred to a board inside the mobile phone through, for example, an FPCB, and through these series of processes, an operation pursuant to the control signal can be performed. However, the above-described conventional structure may make the mobile device inevitably big.

Specifically, an additional pad needs to be formed on the printed circuit in order to connect the buttons to the printed circuit board, the mobile device has to be big enough to provide a space for allowing the FPCB to be connected through thermal-compression.

Moreover, as the FPCB is relatively pricey, the mobile devices using the FPCB can become expensive, and noises can be generated by an interference between the FPCB and a pattern of the printed circuit board. Additional problems of the FPCB can include a high possibility of defective connection between the FPCB and the printed circuit board and an extended time required for assembly.

The related art of the present invention is disclosed in Korea Patent Publication No. 10-2009-0033236 (Apr. 1, 2009).

SUMMARY

The present invention provides a mobile device that has a simplified structure and thus can make a product smaller and improve a productivity.

An aspect of the present invention provides a mobile device that includes: a multi-layer circuit board including a plurality of circuit pattern layers and a plurality of dielectric layers and having a cavity formed on a lateral surface thereof toward an inside thereof; an electrode pad laminated in the cavity and configured to be electrically connected with the circuit pattern layers; and a conductive switch formed on an external peripheral portion of the cavity of the multi-layer circuit board in such a way that the conductive switch is separated from the electrode pad and is contactable with the electrode pad by an external force.

The conductive switch can be made of a flexible material and is configured to be bendable into the cavity.

The electrode pad can be laminated in plurality in the cavity, and the conductive switch can be formed to be selectively contacted with the plurality of electrode pads.

Another aspect of the present invention provides a method of manufacturing a mobile device that includes: preparing a multi-layer circuit board including a plurality of circuit pattern layers and a plurality of dielectric layers; forming a cavity on a lateral surface of the multi-layer circuit board toward an inside of the multi-layer circuit board; laminating an electrode pad in the cavity, the electrode pad being configured to be electrically connected with the circuit pattern layers; and forming a conductive switch on an external peripheral portion of the cavity of the multi-layer circuit board, the conductive switch being separated from the electrode pad and configured to be contactable with the electrode pad by an external force.

BRIEF DESCRIPTION OF THE DRAWINGS

FIG. 4 is a flow diagram showing a method of manufacturing a mobile device in accordance with an embodiment of the present invention.

DETAILED DESCRIPTION

Figure 1:
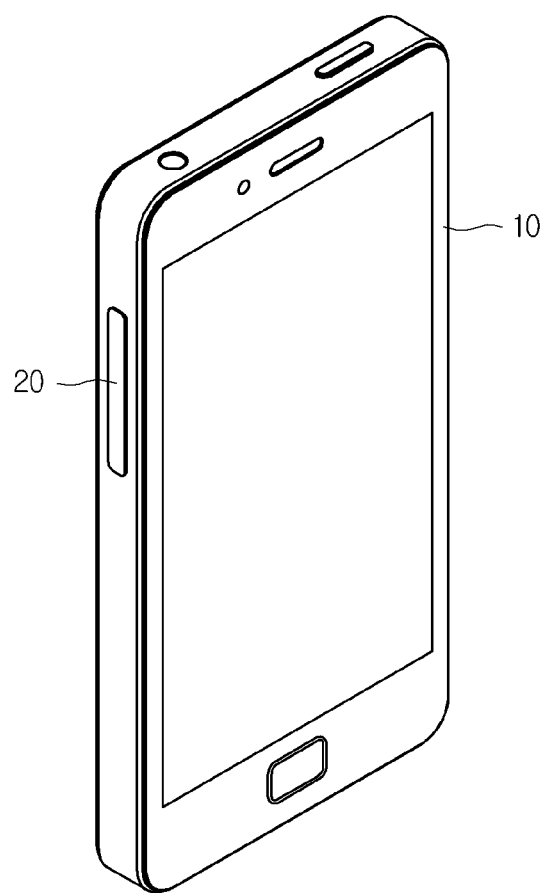
FIG. 1 is a brief illustration of a mobile device in accordance with an embodiment of the present invention.

Hereinafter, certain embodiments of a mobile device and a manufacturing method thereof in accordance with the present invention will be described in detail with reference to the accompanying drawings. In describing the present invention with reference to the accompanying drawings, any identical or corresponding elements will be assigned with same reference numerals, and no redundant description thereof will be provided.

Terms such as "first" and "second" can be used in merely distinguishing one element from other identical or corresponding elements, but the above elements shall not be restricted to the above terms.

When one element is described to be "coupled" to another element, it does not refer to a physical, direct contact between these elements only, but it shall also include the possibility of yet another element being interposed between these elements and each of these elements being in contact with said yet another element.

Figure 2:
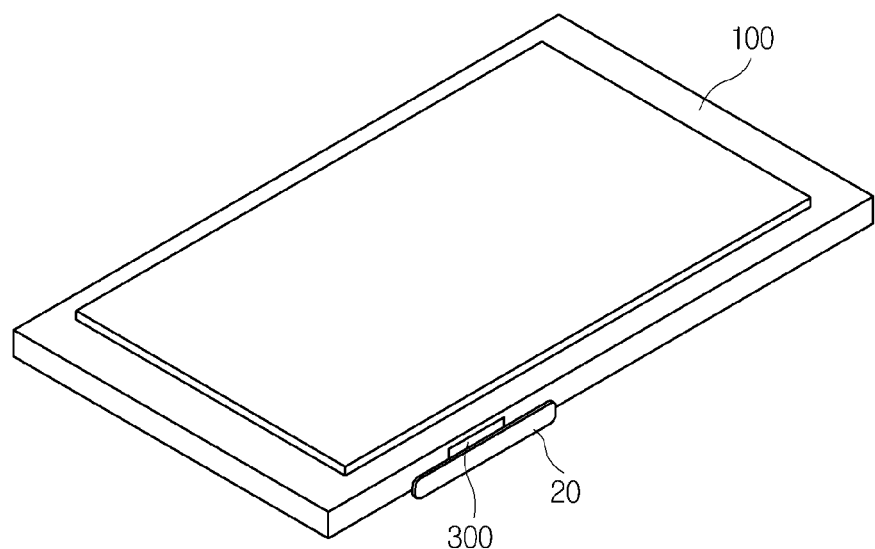
FIG. 2 is a brief illustration of a multi-layer circuit board used in the mobile device in accordance with an embodiment of the present invention.
Figure 3:
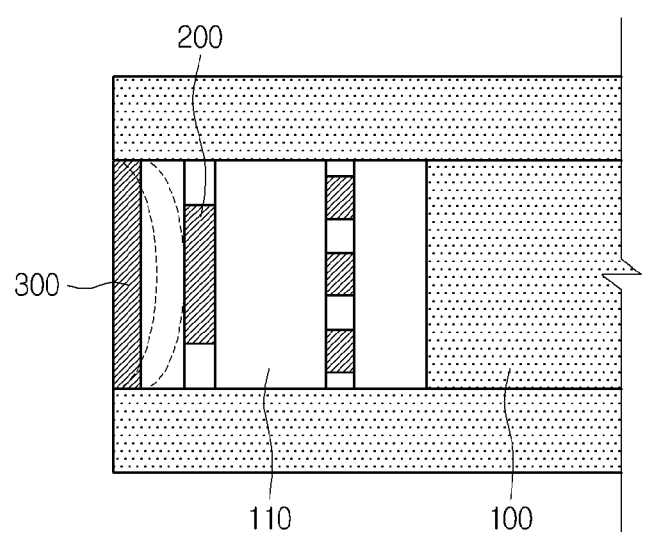
FIG. 3 is a cross-sectional view showing the multi-layer circuit board used in the mobile device in accordance with an embodiment of the present invention.

FIG. 1 is a brief illustration of a mobile device in accordance with an embodiment of the present invention. FIG. 2 is a brief illustration of a multiple-layer circuit board used in the mobile device in accordance with an embodiment of the present invention. FIG. 3 is a cross-sectional view showing the multiple-layer circuit board used in the mobile device in accordance with an embodiment of the present invention.

As illustrated in FIG. 1 to FIG. 3, a mobile device 1000 in accordance with an embodiment of the present invention includes a multi-layer circuit board 100, an electrode pad 200 and a conductive switch 300.

The multi-layer circuit board 100 includes a plurality of circuit pattern layers and a plurality of dielectric layers and has a cavity 110 formed in a lateral surface thereof toward an inside thereof. Various signals can be processed by the mobile device 1000 through the circuit pattern layers formed in the multi-layer circuit board 100. In such a case, the multi-layer circuit board 100 can have a via and the like formed therein for connecting the circuit pattern layers with one another.

The cavity 100, as shown in FIG. 3, is a vacant space formed inwardly in the lateral surface of the multi-layer circuit board 100 and can be formed using a CNC drill, through a punching method using a metallic mold or through a laser drilling method using $CO_2$ or YAG laser.

The electrode pad 200 is laminated in the cavity 110 for electrical connection with the circuit pattern layers. In case a user presses a lateral surface button 20 to input a signal, the electrode pad 200 can make contact with the conductive switch 300 to transfer the input signal to the circuit pattern layers.

In such a case, the electrode pad 200 can be made of a conductive material and can be laminated in the cavity 110 through, for example, a plating process so as to be electrically connected with the circuit pattern layers. Moreover, the electrode pad 200 can be supported by an additional dielectric layer to keep the electrode pad 200 steady, or in various other ways if necessary.

The conductive switch 300 is formed on an external peripheral portion of the cavity 110 of the multi-layer circuit board 100 in such a way that the conductive switch 300 is separated from the electrode pad 200. Accordingly, the conductive switch 300 can be contacted with the electrode pad 200 by an external force and thus can be electrically connected with the electrode pad 200 to allow the signal to be transferred to the circuit pattern layers.

Here, the external force refers to, as shown in FIG. 1 and FIG. 2, a pressure exerted to the conductive switch 300 toward an inside of the cavity 110 when the user presses the lateral surface button 20, in which case the user can input the signal through the lateral surface button 20.

As such, the mobile device 1000 in accordance with the present embodiment has the cavity 110 formed inwardly on the lateral surface of the multi-layer circuit board 100 and has the electrode pad 200 and the conductive switch 300 formed in the cavity 110, thereby making it possible to make a product smaller and improve a productivity by simplifying the structure of the mobile device 1000.

That is, since a signal input configuration can be arranged using the lateral surface of the multi-layer circuit board 100, a more efficient space can be provided on the multi-layer circuit board 100 for disposing other components of the mobile device 1000. Accordingly, a height and a volume of the mobile device 1000 can be relatively smaller.

Moreover, there can be a smaller number of components constituting the mobile device 1000, thereby simplifying a manufacturing process and improving a productivity.

In the mobile device 1000 in accordance with the present embodiment, the conductive switch 300 can be made of a flexible material and thus can be bent into the cavity 110. That is, as shown in FIG. 3, the conductive switch 300 can be curved toward the electrode pad 200 and can be partially contacted with the electrode pad 200 when the external force is exerted thereto.

When the external force is removed, the conductive switch 300 is restored to its original shape by elasticity and thus can be separated from the electrode pad 200.

As such, in the mobile device 1000 in accordance with the present embodiment, the flexible conductive switch 300 can be transformed to allow an easy contact with and separation from the electrode pad 200.

In the mobile device 1000 in accordance with the present embodiment, the electrode pad 200 can be laminated in plurality in the cavity 110, and the conductive switch 300 can be selectively contacted with the plurality of electrode pads 200.

For instance, in case the lateral surface button 20 is configured to input two kinds of signals, for increasing and decreasing the volume, respectively, in the mobile device 1000, there can be two corresponding electrode pads 200 in the cavity 110.

Then, by allowing the conductive switch 300 to be selectively contacted with the two electrode pads 200, the two signals, each for increasing and decreasing the volume, respectively, can be selectively transferred to the circuit pattern layers.

Accordingly, the mobile device 1000 in accordance with the present embodiment can minimize the components required for inputting signals and still can be configured to allow more signals to be inputted.

FIG. 4 is a flow diagram showing a method of manufacturing a mobile device in accordance with an embodiment of the present invention. Here, for the convenience of description and understanding, elements described in the method of manufacturing a mobile device in accordance with an embodiment of the present invention will be described with reference to FIG. 1 to FIG. 3.

As shown in FIG. 4, the method of manufacturing a mobile device in accordance with an embodiment of the present invention starts with preparing a multi-layer circuit board 100, which includes a plurality of circuit pattern layers and a plurality of dielectric layers (S100).

Then, a cavity 110 can be formed on a lateral surface of the multi-layer circuit board 110 toward an inside of the multi-layer circuit board 110 (S200). Here, the cavity 100 is a vacant space formed inwardly in the lateral surface of the multi-layer circuit board 100 and can be formed using a CNC drill, through a punching method using a metallic mold or through a laser drilling method using $CO_2$ or YAG laser Afterwards, an electrode pad 200, which is electrically connected with the circuit pattern layers, can be laminated in the cavity 110 (S300). Here, the electrode pad 200 can be made of a conductive material and can be laminated in the cavity 110 through, for example, a plating process so as to be electrically connected with the circuit pattern layers.

Thereafter, a conductive switch 300, which is separated from the electrode pad 200 and can be contacted with the electrode pad 200 by an external force, can be formed on an external peripheral portion of the cavity 110 of the multi-layer circuit board 100 (S400).

When the external force is exerted, the conductive switch 300 can make contact and be electrically connected with the electrode pad 200, and thus a signal can be transferred to the circuit pattern layers.

As such, in the method of manufacturing a mobile device in accordance with the present embodiment, the cavity 110 is formed inwardly on the lateral surface of the multi-layer circuit board 100, and the electrode pad 200 and the conductive switch 300 are formed in the cavity 110, thereby making it possible to make a product smaller and improve a productivity by simplifying the structure of the mobile device 1000.

In the method of manufacturing a mobile device in accordance with the present embodiment, the conductive switch 300 can be made of a flexible material and thus can be bent into the cavity 110. That is, the conductive switch 300 can be bent toward the electrode pad 200 and can be partially contacted with the electrode pad 200 when the external force is exerted thereto.

When the external force is removed, the conductive switch 300 is restored to its original shape by elasticity and thus can be separated from the electrode pad 200.

As such, in the method of manufacturing a mobile device in accordance with the present embodiment, the flexible conductive switch 300 can be transformed to allow an easy contact with and separation from the electrode pad 200.

In the method of manufacturing a mobile device in accordance with the present embodiment, the electrode pad 200 can be laminated in plurality in the cavity 110, and the conductive switch 300 can be selectively contacted with the plurality of electrode pads 200.

Accordingly, the method of manufacturing a mobile device in accordance with the present embodiment can minimize the components required for inputting signals and still can be configured to allow more signals to be inputted.

The elements associated with the method of manufacturing a mobile device in accordance with an embodiment of the present invention have been described above in detail with reference to the mobile device 1000 in accordance with an embodiment of the present invention and thus will not be described redundantly.

Although certain embodiments of the present invention have been described hitherto, it shall be appreciated that the present invention can be variously modified and permutated by those of ordinary skill in the art to which the present invention pertains by supplementing, modifying, deleting and/or adding an element without departing from the technical ideas of the present invention, which shall be defined by the claims appended below. It shall be also appreciated that such modification and/or permutation are also included in the claimed scope of the present invention.

What is claimed is:

1. A mobile device comprising: a multi-layer circuit board comprising a plurality of circuit pattern layers and a plurality of dielectric layers and having a cavity formed on a lateral surface thereof toward an inside thereof; an electrode pad laminated in the cavity and configured to be electrically connected with the circuit pattern layers; and a conductive switch formed on an external peripheral portion of the cavity of the multi-layer circuit board in such a way that the conductive switch is separated from the electrode pad and is contactable with the electrode pad by an external force, wherein the electrode pad is laminated in plurality in the cavity, and wherein the conductive switch is formed to be selectively contacted with the plurality of electrode pads.

2. The mobile device of claim 1, wherein the conductive switch is made of a flexible material and is configured to be bendable into the cavity.

3. The mobile device of claim 2, wherein the electrode pad is laminated in plurality in the cavity, and
wherein the conductive switch is formed to be selectively contacted with the plurality of electrode pads.

4. A method of manufacturing a mobile device, comprising: preparing a multi-layer circuit board comprising a plurality of circuit pattern layers and a plurality of dielectric layers; forming a cavity on a lateral surface of the multi-layer circuit board toward an inside of the multi-layer circuit board; laminating an electrode pad in the cavity, the electrode pad being configured to be electrically connected with the circuit pattern layers; and forming a conductive switch on an external peripheral portion of the cavity of the multi-layer circuit board, the conductive switch being separated from the electrode pad and configured to be contactable with the electrode pad by an external force, wherein the electrode pad is laminated in plurality in the cavity, and wherein the conductive switch is formed to be selectively contacted with the plurality of electrode pads.

5. The method of claim 4, wherein the conductive switch is made of a flexible material and is configured to be bendable into the cavity.

6. The method of claim 5, wherein the electrode pad is laminated in plurality in the cavity, and
wherein the conductive switch is formed to be selectively contacted with the plurality of electrode pads.

* * * * *